(12) United States Patent
Wirth

(10) Patent No.: US 12,494,388 B2
(45) Date of Patent: Dec. 9, 2025

(54) METHODS AND APPARATUS FOR MEASURING TEMPERATURE USING CENTERFIND SYSTEMS

(71) Applicant: Applied Materials, Inc., Santa Clara, CA (US)

(72) Inventor: Paul Zachary Wirth, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 996 days.

(21) Appl. No.: 17/580,287

(22) Filed: Jan. 20, 2022

(65) Prior Publication Data

US 2022/0270899 A1 Aug. 25, 2022

Related U.S. Application Data

(60) Provisional application No. 63/153,174, filed on Feb. 24, 2021.

(51) Int. Cl.
| | |
|---|---|
| *H01L 21/67* | (2006.01) |
| *B25J 9/00* | (2006.01) |
| *B25J 13/08* | (2006.01) |
| *H01L 21/677* | (2006.01) |
| *H01L 21/68* | (2006.01) |

(52) U.S. Cl.
CPC ...... *H01L 21/67248* (2013.01); *B25J 9/0009* (2013.01); *B25J 13/087* (2013.01); *H01L 21/67742* (2013.01); *H01L 21/68* (2013.01); *G05B 2219/49169* (2013.01)

(58) Field of Classification Search
CPC ............. B25J 9/0009; B25J 13/087; G05B 2219/49169; H01L 21/67248; H01L 21/67742; H01L 21/68
See application file for complete search history.

(56) References Cited

U.S. PATENT DOCUMENTS

| | | | |
|---|---|---|---|
| 6,556,887 B2 | 4/2003 | Freeman et al. | |
| 8,224,607 B2 | 7/2012 | Sakhare et al. | |
| 2003/0014155 A1 | 1/2003 | Pencis et al. | |
| 2004/0199291 A1* | 10/2004 | Freeman ................. | B25J 9/107 |
| | | | 700/258 |

FOREIGN PATENT DOCUMENTS

WO 03007349 A2 1/2003

* cited by examiner

*Primary Examiner* — Mark R Gaworecki
(74) *Attorney, Agent, or Firm* — Lowenstein Sandler LLP

(57) ABSTRACT

Disclosed are systems and methods for measuring the temperature change of one or more substrates within a semiconductor processing system. The temperature change information may be used to optimize throughput of substrates within the system and to troubleshoot quality issues that may be impacted by temperature.

20 Claims, 8 Drawing Sheets

METHODS AND APPARATUS FOR MEASURING TEMPERATURE USING CENTERFIND SYSTEMS

FIELD

The disclosure relates generally to the field of robotics and methods and systems for measuring temperature of substrates in vacuum processing systems using centerfind systems.

BACKGROUND

Semiconductor substrates are commonly processed in vacuum processing systems. These systems include one or more chambers, each performing substrate processing operations such as etching, chemical vapor deposition, chemical-mechanical polishing or physical vapor deposition, which can include heating or cooling of the substrate, and a plasma to assist the process. Typically, the environment within such processing chambers is maintained at a low subatmospheric pressure and at a predetermined temperature. The transfer of one or more substrates to and from a chamber and to and from the outside of the system is generally performed mechanically by a robot arm at the end of which is a substrate retaining component (e.g., a blade or end effector). As the robot retrieves, places and transfers one or more substrates between locations, the temperature conditions change, for example, from high process temperature conditions to ambient conditions.

Process chamber operations may yield inconsistent results when there is variation in the initial temperature of one or more substrates to be processed. For example, one or more substrates may be processed at an elevated temperature (e.g., a target temperature plus or minus incremental adjustments of about ±1° C. to about ±1000° C.). During process flows where the one or more substrates is transferred from one chamber to another chamber, or from a chamber to a load lock, the substrates will experience varying levels of temperature loss. Such temperature loss may result in the differing initial temperatures of individual substrates within the same batch and/or differing initial temperatures of substrates from batch to batch. This variability in initial temperatures may impact the properties of a film deposited on the one or more substrates during a temperature sensitive process operation. It is desirable to monitor the temperature change and/or absolute temperatures of one or more substrates over time and between locations within a vacuum processing system, which would enable more consistent substrate processing and process chamber matching. Such temperature information also may be used to improve substrate throughput in a system by reducing cooling times or increasing transfer times.

BRIEF SUMMARY

An electronic device manufacturing system, comprising: a robot apparatus configured to transport a substrate; a first sensor system configured to detect the substrate supported by the robot apparatus; and a controller to: acquire a first set of positional metrics of the substrate generated by the first sensor system; determine a first radius of the substrate based on the first set of positional metrics; acquire a second set of positional metrics of the substrate generated by the first sensor system or a second sensor system; determine a second radius of the substrate based on the second set of positional metrics; determine a change in radius for the substrate based on the first radius and the second radius; and determine a temperature change of the substrate based on the change in radius and a coefficient of thermal expansion of the substrate.

A method of determining a temperature change of a substrate, the method comprising: acquiring a first set of positional metrics of the substrate generated by a first sensor system; determining a first radius of the substrate based on the first set of positional metrics; acquiring a second set of positional metrics of the substrate generated by the first sensor system or a second sensor system; determining a second radius of the substrate based on the second set of positional metrics; determining a change in radius for the substrate based on the first radius and the second radius; and determining a temperature change of the substrate based on the change in radius and a coefficient of thermal expansion of the substrate.

A computer-readable medium having stored thereon a plurality of instructions, the plurality of instructions comprising instructions which, when executed by a processor, determine a change in temperature of a substrate in a semiconductor processing system comprising: acquiring a first set of positional metrics of the substrate generated by a first sensor system; determining a first radius of the substrate based on the first set of positional metrics; acquiring a second set of positional metrics of the substrate generated by the first sensor system or a second sensor system; determining a second radius of the substrate based on the second set of positional metrics; determining a change in radius for the substrate based on the first radius and the second radius; and determining a temperature change of the substrate based on the change in radius and a coefficient of thermal expansion of the substrate.

BRIEF DESCRIPTION OF THE DRAWINGS

The present disclosure is illustrated by way of example, and not by way of limitation, in the figures of the accompanying drawings in which like references indicate similar elements.

DETAILED DESCRIPTION

Figure 1:
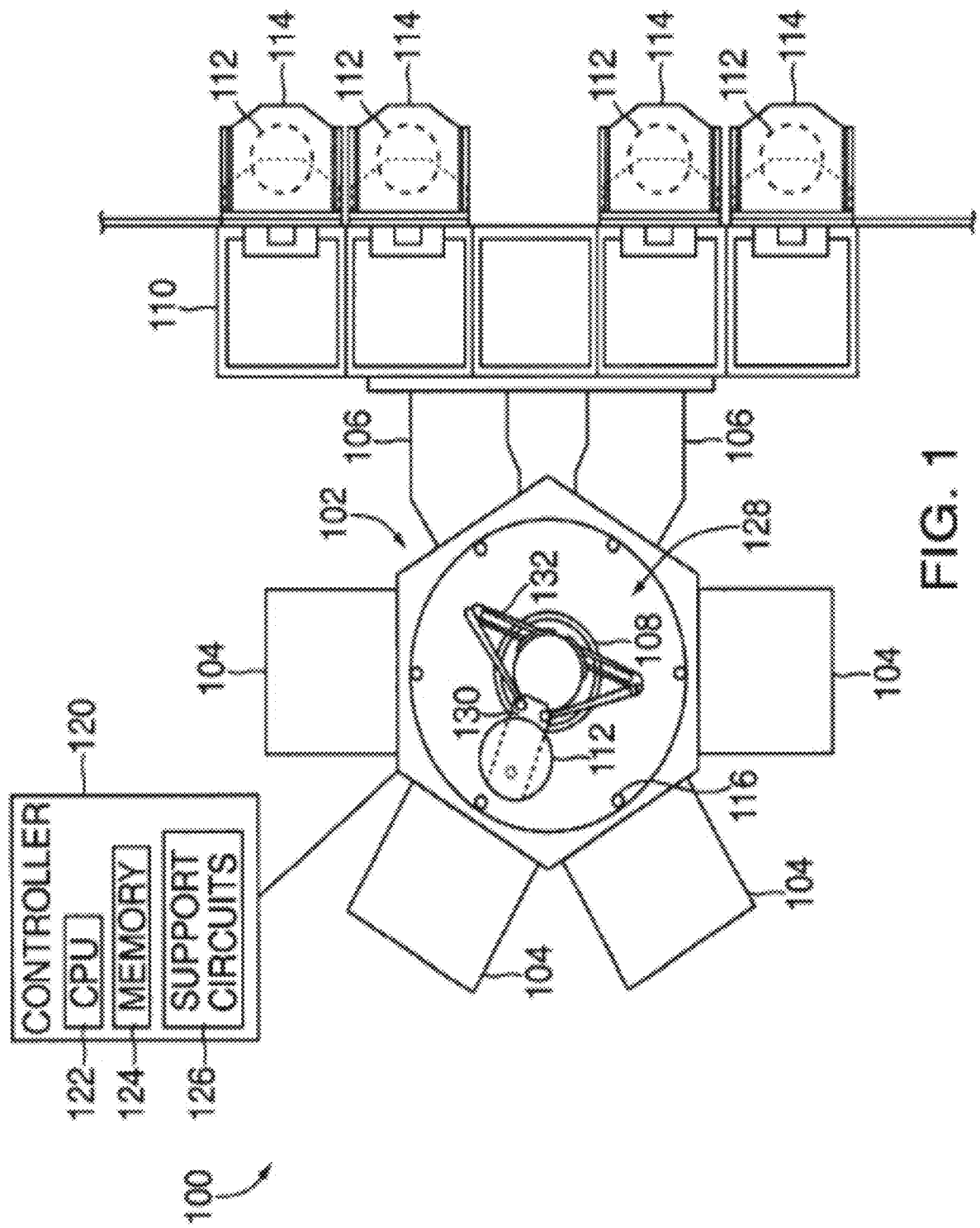
FIG. 1 is a plan view of one embodiment of a semiconductor processing system in which a method for determining a position of a robot may be practiced.

According to embodiments, disclosed herein are systems, methods and computer program products for measuring substrate temperatures and temperature changes within a vacuum processing system using one or more local centerfind systems (e.g., one or more sensor systems). Such systems, methods and computer program products can monitor the temperature change and/or absolute temperatures of one or more substrates over time and between locations within a vacuum processing system and can enable more consistent substrate processing and process chamber matching using existing sensors within a transfer chamber that might not include temperature sensors for measuring temperatures of substrates. The temperature information also may be used to improve substrate throughput in a vacuum processing system by reducing cooling times or increasing transfer times. In embodiments, the systems, methods and computer program products may be used to troubleshoot processing issues within a process chamber, for example, batch-to-batch or substrate-to-substrate variability and/or out of specification results (e.g., film properties, particle defects, metal defects, etc.).

The systems, methods and computer program products described herein may include a centerfind system and method configured to acquire positional metrics of substrates as they are placed in and retrieved from a process chamber. The one or more substrates may be made from a base material comprised of silicon, gallium arsenide, glass, sapphire and/or various other materials and combinations. These materials expand and contract as the temperature changes by a linear factor known as the Coefficient of Thermal Expansion (CTE). In embodiments, a robot apparatus may operate with a centerfind system and method to determine the radius of a substrate. As the temperature of the substrate changes, the size of the substrate also changes, that is, determining the radius of a substrate may also indicate its temperature. For example, the radius of a silicon substrate changes by about 2.6e-6 for every change in degree Celsius, that is, for every one degree Celsius the radius changes by about 0.000026 mm (or any unit dimension so long it's the same in the numerator and denominator).

The centerfind system and method may be used to acquire positional metrics of one or more substrate and then determine the center of the one or more substrates for placing or retrieving the substrate with a robot arm and blade in a chamber. This information may be used to determine the one or more substrate's radius (or diameter) as a secondary result of determining the center and together with the CTE to determine the temperature or temperature change of the one or more substrates, for example, before and after processing, between chambers, etc. Advantages of the centerfind system to measure substrate temperature or temperature change over other systems include: 1) the tracking of the temperature loss between substrate motions using existing hardware; 2) process results can shift if the substrate starting temperature varies—known semiconductor processing tools do not track substrate temperature when inserted into the chamber; and 3) methods as described herein are non-contact and do not rely on substrate emissivity as infrared devices would (i.e., substrate emissivity can vary widely with production substrates).

In some process flows, for example, where the substrate temperature during transfer may benefit from being controlled and/or tracked, a temperature sensor (e.g., a pyrometer or infrared sensor) may be attached to the mainframe and/or the robot apparatus. In at least one embodiment, the temperature sensor is positioned on the robot arm at about the halfway point between the robot arm's retracted position and extended position into the slip belt or into a process chamber (i.e., positioned about halfway through the extension). Combining a temperature sensor on the robot arm together with the centerfind system may enhance the accuracy and precision of the temperature measurement and may be useful to resolve process excursions on more process chambers than currently have standalone temperature measurement. In embodiments, a temperature measurement device is attached to all mainframe robots that use centerfind systems.

A semiconductor processing apparatus may include a preheating station (e.g., a pre-heater in the load lock) configured to preheat a substrate within the load lock to an elevated temperature (i.e., above room temperature), for example, a target temperature plus about 1° C. to about 1000° C., or any individual temperature or sub-range within this range. Once preheated, the substrate may be retrieved from the load lock by a robot blade and moved to a process chamber. In embodiments, the robot may include three blades and may simultaneously (or sequentially) retrieve two preheated substrates from the load lock. The robot may transfer the two preheated substrates to the process chamber one at a time. For example, the robot may place a first preheated substrate on a first pedestal, then while the process chamber rotates its pedestals to orient a second (empty) pedestal for receiving a second substrate by the robot, the robot may either wait or rotate its blades, and place the second preheated substrate on the second pedestal.

While the substrates are 1) retrieved from a load lock, 2) transferred to a process chamber via, for example, a transfer chamber at ambient conditions, and 3) placed within the process chamber, the substrates begin to cool, lowering their temperature to below their preheated temperature. According to embodiments, the systems, methods and computer program products described herein may determine how much the temperature of the substrates has changed and compare the final temperature to an initial processing temperature for a particular process chamber. If the temperature or temperature change is outside of a specification (e.g., a range), then the process chamber may, for example, delay processing until the temperature of the one or more substrates is within specification, or the substrates may be preheated to meet the specification. For example, the temperature specification may be the initial process temperature plus or minus about 50° C., plus or minus about 40° C., plus or minus about 30° C., plus or minus about 25° C., plus or minus about 20° C., plus or minus about 15° C., plus or minus about 10° C., plus or minus about 5° C., plus or minus about 2° C., plus or minus about 1° C., or plus or minus about 1° C. to plus or minus about 50° C., or any individual value or sub-range within this range. When the one or more substrates is removed from the process chamber and transported to, for example, a load lock, the temperature will change and the one or more substrates may need to be further cooled within the load lock chamber to the original preheated temperature or alternatively may need to be heated to reach the desired preheated temperature for a subsequent process operation.

In embodiments, a substrate may be preheated from about room temperature (e.g., about 20° C. to about 25° C.) to an elevated temperature, for example, plus about 1° C. to about 500° C., or any individual value or sub-range therein, and the substrate may then be processed in the process chamber at the elevated temperature. As discussed above, this relatively large change in temperature results in a detectable change in the radius of the substrate. For example, the radius (or diameter) of a silicon substrate may increase by about 4 mm between room temperature and about 550° C.

According to embodiments, a robot used to transport the substrates between the load lock and a process chamber may have an accuracy of about 0.01 μm to about 0.5 μm in part due to an encoder that has from about 1 million counts per revolution to about 67 million counts per revolution. The robot may be able to determine the center of a substrate within about 1.0 μm to about 5.0 μm. The centerfind algorithm may determine the radius of a substrate held on a robot blade to within about 0.5 μm to about 5.0 μm. The methods, systems and computer program products disclosed herein may determine the temperature and temperature change of the substrate within about ±5° C. to about ±20° C.

In at least one embodiment, each of the valves (e.g., slit valves) within the process chamber may include an LCF sensor system, as well as one or more other locations where a substrate is positioned (i.e., placed and retrieved). One or more LCF sensor system may include one or more sensors. One type of sensor includes a pair of an emitter and a detector. The emitters may each emit a beam (e.g., a laser beam) that is detected by a detector. When an object (e.g., a substrate) is interposed between an emitter and a detector, the beam may be broken, indicating the presence of the substrate. Each of the pairs of emitters and detectors may have a known position and/or orientation relative to other pairs of emitters and detectors. The known positions/orientations of the emitters and detectors may be used along with timing information indicating when an object was detected by each detector to determine a center of a detected substrate as well as a radius of the detected substrate. The substrate may have a known radius (e.g., 300 mm) at room temperature and a known CTE. The known radius at room temperature, the known CTE, and a measured radius may be used to estimate a current temperature of the substrate in embodiments.

For example, a substrate may be about 300 mm in diameter at room temperature, so the LCF sensor beam may be broken initially with the front edge of the substrate, and then returns to a ready state (i.e., beam intact), after the robot arm has extended the substrate another 250 mm. The measurement of the substrate's radius may be indicative of its temperature at the time and place of its measurement. In embodiments, a plurality of LCF sensors may be positioned about a substrate pedestal. For example, two to four LCF sensors may be positioned within a mainframe of a process chamber and configured to measure the positional metrics of the substrate. In one embodiment, a substrate centerfind method may rotate the substrate while one ore more LCF sensors measures points along the edges of the substrate. The radius of the substrate may then be determined. In embodiments, a four beam LCF system may provide more accuracy than a two beam LCF system because the radius of the substrate can be more precisely determined.

In some embodiments, the centerfind system may use a plurality of LCF sensors to determine the position of the substrate. A vacuum robot does not grab a substrate, for example, by its edges, but rather lifts the substrate from underneath onto a blade or places the substrate onto a pad. From wherever the substrate is retrieved, the centerfind system and method enable the robot apparatus to align and position the center of the substrate with a center of the blade. In embodiments, a robot arm having a plurality of blades, a plurality of which have a substrate positioned thereon, moves to a new chamber and as the blade extends into the chamber, it positions one substrate at a time with the other substrate(s) just resting on the other blade(s). As the substrate passes through the LCF sensor beam(s), the leading substrate edge breaks the beam(s) and when the substrate moves completely out of the beam, the LCF sensor returns to a ready state. Each LCF sensor may record two measurements (i.e., when the beam is broken and when the beam is reengaged), so in a system with three LCF sensors, six metrics of the substrate's position may be recorded. An LCF algorithm may determine a fit for those six points to find the best circle indicative of the substrate position that aligns with the robot positions where the beams were broken. Using the resulting fit, the radius (or diameter) of the substrate may be determined. Additional programming may determine the temperature based on the radius (or diameter) of the substrate as determined by the LCF system and centerfind algorithm and the CTE for the substrate material.

In embodiments, the time a substrate spends on a robot blade between when the substrate leaves the process chamber until it is placed in, for example, a load lock of another process chamber, may be indicative of the temperature change during this period. Taking into account the sequencing and other actions by the robot arm, the time may vary from about 1 second to about 150 seconds, or about 2 seconds to about 120 seconds, or any individual value or sub-range within these ranges. Based on the time the substrate is on a blade, the change in substrate temperature may be tracked from the process chamber, for example, at about 450° C., about 550° C. or about 600° C., to determine how much the substrate has cooled before it is even placed in the load lock.

In at least one embodiment, a temperature measurement device (e.g., pyrometer or infrared thermometer) may be positioned on the robot apparatus and/or mainframe and may be calibrated using the centerfind algorithm and the substrate material's CTE to determine the substrate radius and return absolute temperature measurements as well as changes in temperature. For example, a process chamber may process a pure silicon substrate at room temperature and at an elevated temperature. In some embodiments, a local centerfind (LCF) calibration substrate may be an aluminum substrate having a nominal diameter of about 300 mm at room temperature (about 20° C.), which may be supported by the robot blade when performing the LCF calibration. One or more sensors of the centerfind system (i.e., LCF sensors) and method may be used to acquire positional metrics of the calibration substrate to determine the substrate's radius. In embodiments, the one or more sensors may be selected from an optical sensor, a proximity sensor, a limit switch, a reed switch, a hall-effect switch and combinations thereof. The radius of the silicon or aluminum calibration substrate at two different temperatures may be determined and the system may be calibrated to return the corresponding temperatures. In embodiments, the temperature change of a preheated, unprocessed substrate entering a process chamber and the processed substrate leaving the process chamber may be determined using the centerfind system and methods together with the temperature measurement device. In embodiments, the temperature measurement device positioned on the robot apparatus can measure the temperature of or near the substrate and, using this information, the systems, methods and computer program products can determine whether the substrate is at an expected temperature (i.e., the preheated temperature, the initial process temperature, the processing temperature, etc.). If the temperature is outside of specification, the system and method may return an alarm, may delay processing and/or may heat the substrate as needed.

According to embodiments, an electronic device manufacturing system may further include a transfer chamber, wherein the first sensor is disposed within the transfer chamber proximate to a first aperture in a first sidewall of the transfer chamber, and wherein the second sensor is disposed within the transfer chamber proximate to a second sidewall of the transfer chamber. The first sensor may generate the first set of positional metrics at a first time during a first retraction or extension of the robot apparatus, and wherein the second sensor is to generate the second set of positional metrics at a second time during a second retraction or extension of the robot apparatus.

FIG. 1 depicts an example embodiment of a semiconductor processing system 100 wherein a method for determining a position of a substrate 112 may be practiced. An exemplary processing system 100 includes a transfer chamber 102 surrounded by one or more process chambers 104, a factory interface 110 and one or more load lock chambers 106. The load lock chambers 106 may be disposed between the transfer chamber 102 and the factory interface 110 to facilitate substrate transfer between a vacuum environment within the transfer chamber 102 and an ambient environment maintained within the factory interface 110. Although the method for determining the position of a substrate is described with reference to the exemplary processing system 100, the description is illustrative and the method may be practiced wherever the determination or position of a substrate is desired in applications where the substrate is exposed to changes in temperature. For example, the method may be practiced to determine the position of a substrate operating in a linear transfer chamber as well as in systems having process chambers arranged in a cluster configuration.

The factory interface 110 may include one or more substrate storage cassettes 114. Each cassette 114 configured to store one or more substrates therein. The factory interface 110 may be maintained at or near atmospheric pressure. In embodiments, filtered air is supplied to the factory interface 110 to minimize particles within the factory interface to reduce substrate defects.

Transfer chamber 102 my be fabricated from a single piece of material such as aluminum. Transfer chamber 102 may define an evacuable interior volume 128 through which substrates may be transferred between the process chambers 104 in communication with the exterior of the transfer chamber 102. A pumping system (not shown) may be configured to evacuate the transfer chamber 102 through a port disposed on the chamber floor to maintain vacuum within the transfer chamber 102. In embodiments, the pumping system includes a roughing pump in communication with a turbomolecular or a cryogenic pump.

The process chambers 104 may be bolted to the exterior of the transfer chamber 102. Examples of process chambers 104 that may be utilized include etch chambers, physical vapor deposition chambers, chemical vapor deposition chambers, ion implantation chambers, orientation chambers, lithography chambers, chemical mechanical planarization chamber and the like. Different process chambers 104 may be attached to the transfer chamber 102 to provide a processing sequence necessary to form a predefined structure or feature upon the substrate surface.

The load lock chambers 106 may be disposed between the factory interface 110 and the transfer chamber 102. The load lock chambers 106 may be used to facilitate transfer of the substrates between the vacuum environment of the transfer chamber 102 and the ambient environment of the factory interface 110 without loss of vacuum within the transfer chamber 102. Each load lock chamber 106 may be selectively isolated from the transfer chamber 106 and the factory interface 110 through the use of one or more slit valves 226 (see FIG. 2).

The substrate transfer robot 108 may be disposed in the interior volume 128 of the transfer chamber 102 to facilitate transfer of the substrates 112 between the various chambers surrounding the transfer chamber 102. The robot 108 may include one or more blades configured to support one or more substrates during transfer. For example, the robot 108 may have two blades, each independently controllable by a motor (known as a dual blade robot) or may have two blades attached to the robot 108 through a common linkage.

In at least one embodiment, the transfer robot 108 has a single blade 130 attached to the robot 108 by a (frog-leg) linkage or other type of linkage 132. Alternatively, the transfer robot 108 may have multiple blades. The transfer robot 108 may include one or more arms, each of which may be 1-link arms, 2-link arms, 3-link arms, and so on. One or more LCF sensor systems 116 may be disposed proximate each of the processing chambers 104 to trigger data acquisition of the robot's operational parameters or metrics utilized in determining the position of the substrate 112. The data may be used separately or in concert with the robot parameters to determine the radius of a substrate 112 retained on the blade 130. In embodiments, an LCF sensor system 116 including a bank of LCF sensors may be disposed on or in the transfer chamber 102 proximate the passages coupling the transfer chamber 102 to the load lock 106 and process chambers 104. The sensor system 116 may include one or more sensors that are utilized to trigger data acquisition of robot metrics and/or substrate positional information. According to at least one embodiment, a first sensor system may be disposed within the transfer chamber proximate to a first aperture in a first sidewall of the transfer chamber. The first sensor system may be configured to generate a first set of positional metrics at a first time during retraction of the robot apparatus, and generate a second set of positional metrics at a second time during extension of the robot apparatus.

To facilitate control of the system 100 as described above, a controller 120 may be in communication with the system 100. The controller 120 may include a CPU 122, a memory 124 and support circuits 126. The CPU 122 may be one of any form of computer processor that can be used to control various chambers and subprocessors. The memory 124 may be in communication with the CPU 122. The memory 124, or computer-readable medium, may be one or more of a readily-available memory such as a random access memory (RAM) read-only memory (ROM), floppy disk, hard drive, device buffer or any other form of digital storage, local or remote. The support circuits 126 may be in communication with the CPU 122 for supporting the processor. These circuits 126 may include cache, power supplies, clock circuits, input-output circuitry, subsystems and the like.

According to embodiments, the controller may be configured to acquire a first set of positional metrics of a first substrate of the one or more substrates generated by the first sensor system, determine a first radius of the first substrate based on the first set of positional metrics, acquire a second set of positional metrics of the first substrate generated by the first sensor system or the second sensor system, determine a second radius of the first substrate based on the second set of positional metrics, determine a change in radius for the first substrate based on the first radius and the second radius, and determine a temperature change of the first substrate based on the change in radius and a coefficient of thermal expansion of the first substrate. In at least one embodiment, the controller may be further configured to receive a temperature measurement generated by the at least one temperature sensor and compare the temperature measurement with a temperature of the first substrate. In at least one embodiment, the controller may further compare the temperature measurement with an initial substrate temperature for processing the first substrate and, if the temperature measurement is within plus or minus about 50° C. of the initial substrate temperature, initiate substrate processing, or if the temperature measurement is more than plus or minus about 50° C., wait a period of time before initiating substrate processing. In embodiments, the controller additionally may determine a first temperature of the first substrate based on the first radius and the coefficient of thermal expansion of the first substrate or determine a second temperature of the first substrate based on the second radius and the coefficient of thermal expansion of the first substrate, compare the first temperature or the second temperature with an initial substrate temperature for processing the first substrate, and if the first temperature or second temperature is within plus or minus about 50° C. of the initial substrate temperature, initiate substrate processing, or if the first temperature or second temperature is more than plus or minus about 50° C., wait a period of time before initiating substrate processing. The determined temperatures may be relative temperatures in some embodiments. Alternatively, if a radius of the substrate at room temperature is known, then the determined temperatures may be absolute temperatures. According to at least one embodiment, the controller may determine a first temperature or a second temperature of the first substrate based on the temperature change of the first substrate, compare the first temperature or the second temperature with an initial substrate temperature for processing the first substrate, and if the first temperature or second temperature is within plus or minus about 50° C. of the initial substrate temperature, initiate substrate processing, or if the first temperature or second temperature is more than plus or minus about 50° C., wait a period of time before initiating substrate processing.

Figure 2:
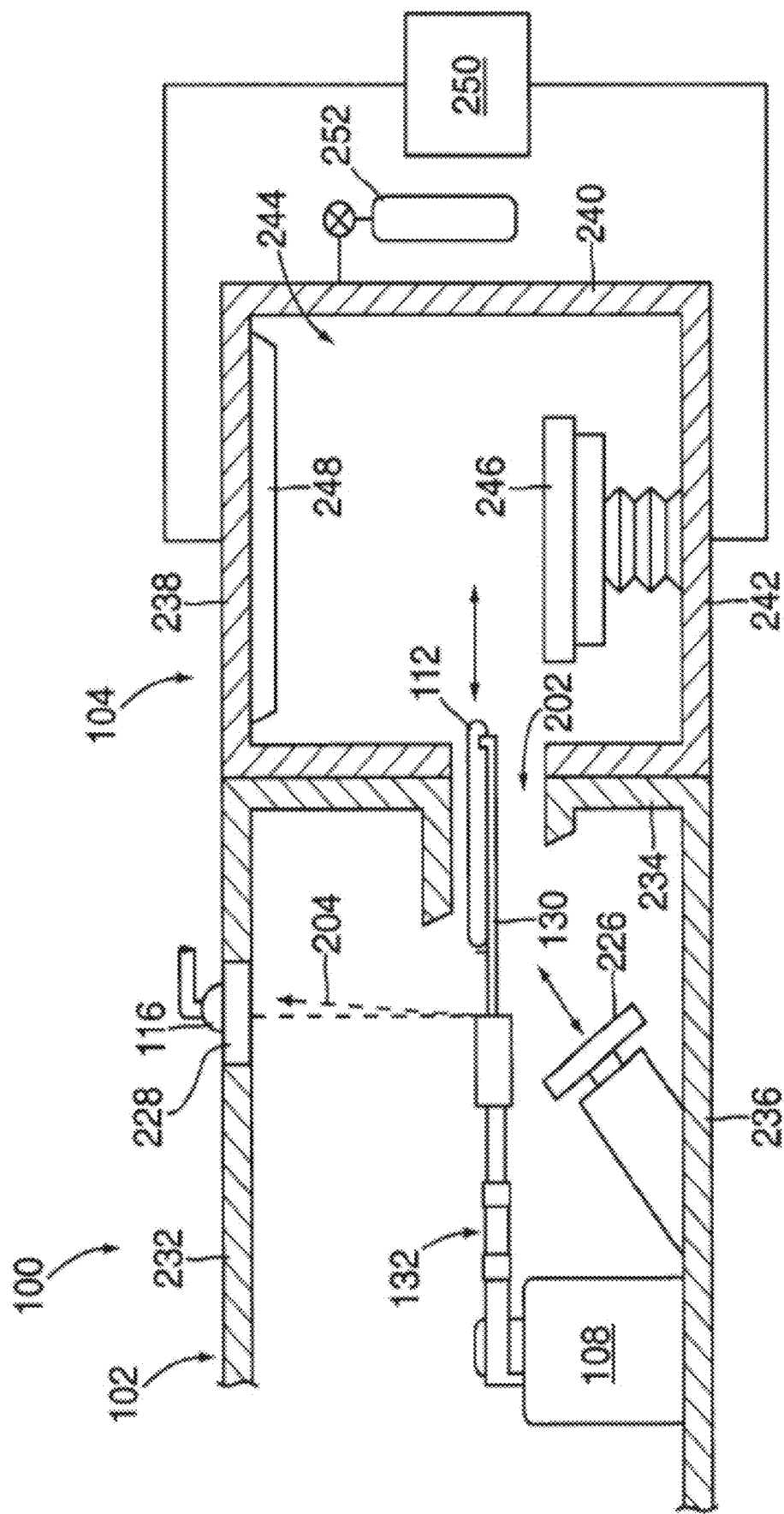
FIG. 2 is a partial sectional view of the processing system of FIG. 1.

FIG. 2 shows a partial sectional view of the system 100 illustrating the transfer chamber 102 and one of the process chambers 104 in communication therewith. Although the illustrative substrate transfer is described between the process chamber 104 and the transfer chamber 102, the method of transfer described below may be utilized when transferring substrates with the load lock chamber 106, other chambers or within the transfer chamber itself wherever information regarding thermal change in the substrate 112 is desired.

The exemplary transfer chamber 104 may include a bottom 242, sidewalls 240 and lid 238 that enclose a process volume 244. A pedestal 246 may be disposed within the process volume 244 and is configured to support the substrate 112 during processing. A target 248 may be in communication with the lid 238 and may be biased by a power source 250. In embodiments, gas supply 252 is coupled to the process chamber 104 and supplies process and other gases to the process volume 244. The supply 252 may provide a process gas such as argon from which a plasma can be formed. Ions from the plasma may collide against the target 248, removing material that is then deposited on the substrate 112.

In embodiments, the transfer chamber 102 includes a bottom 236, sidewalls 234 and lid 232. The transfer robot 108 may be disposed on the bottom 236 of the transfer chamber 102. One sidewall 236 of the transfer chamber 102 may include a port 202 through which the substrate 112 can pass via the transfer robot 108 to the interior of the process chamber 104. The port 202 may be selectively sealed by a slit valve 226 to isolate the transfer chamber 102 from the process chamber 104. The slit valve 226 may move to an open position as shown in FIG. 2 to allow transfer of the substrate 112 between the chambers.

The lid 232 of the transfer chamber 102 may include a window 228 disposed proximate the port 202. The LCF sensor 116 may be disposed on or near the window 228 so that the LCF sensor 116 may view a portion of the robot 108 and the substrate 112 as the substrate passes through the port 202. The window 228 may be fabricated of quartz or other material that does not substantially interfere with the detection mechanism of the LCF sensor 116, for example, a beam of light emitted and reflected back to the LCF sensor 116 through the window 228. In another embodiment, the LCF sensor 116 may emit a beam through the window 228 to a second sensor positioned on the exterior side of a second window disposed in the bottom 236 of the chamber 102 (second sensor and second window not shown).

In embodiments, the LCF sensor 116 may be disposed on the exterior of the window 228 so that the LCF sensor 116 is isolated from the environment of the transfer chamber 102. Alternatively, other positions of the LCF sensor 116 may be utilized including those within the chamber 102 as long as the LCF sensor 116 may be periodically tripped by motion of the robot 108 or substrate 112 therethrough. The LCF sensor 116 may be in communication with the controller 120 and configured to record one or more robot or substrate metrics in each sensor state. The LCF sensor 116 may include a separate emitting and receiving unit or may be self-contained such as "thru-beam" and "reflective" sensors. The LCF sensor 116 may be a thru-beam optical sensor or a reflective optical sensor suitable for detecting the presence of the substrate.

In one embodiment, the LCF sensor 116 includes an optical emitter and receiver disposed on the exterior of the transfer chamber. The LCF sensor 116 may be positioned such that the robot 108 or substrate 112 interrupts a signal from the sensor, such as a beam 204 of light. The interruption and return to an uninterrupted state of the beam 204 causes a change in state of the LCF sensor 116. For example, the LCF sensor 116 may have a 4 to 20 mA output, where the sensor 116 outputs 4 mA in the uninterrupted state while the sensor outputs 20 mA in the interrupted state. Sensors with other outputs may be utilized to signal the change in sensor state.

Figure 3:
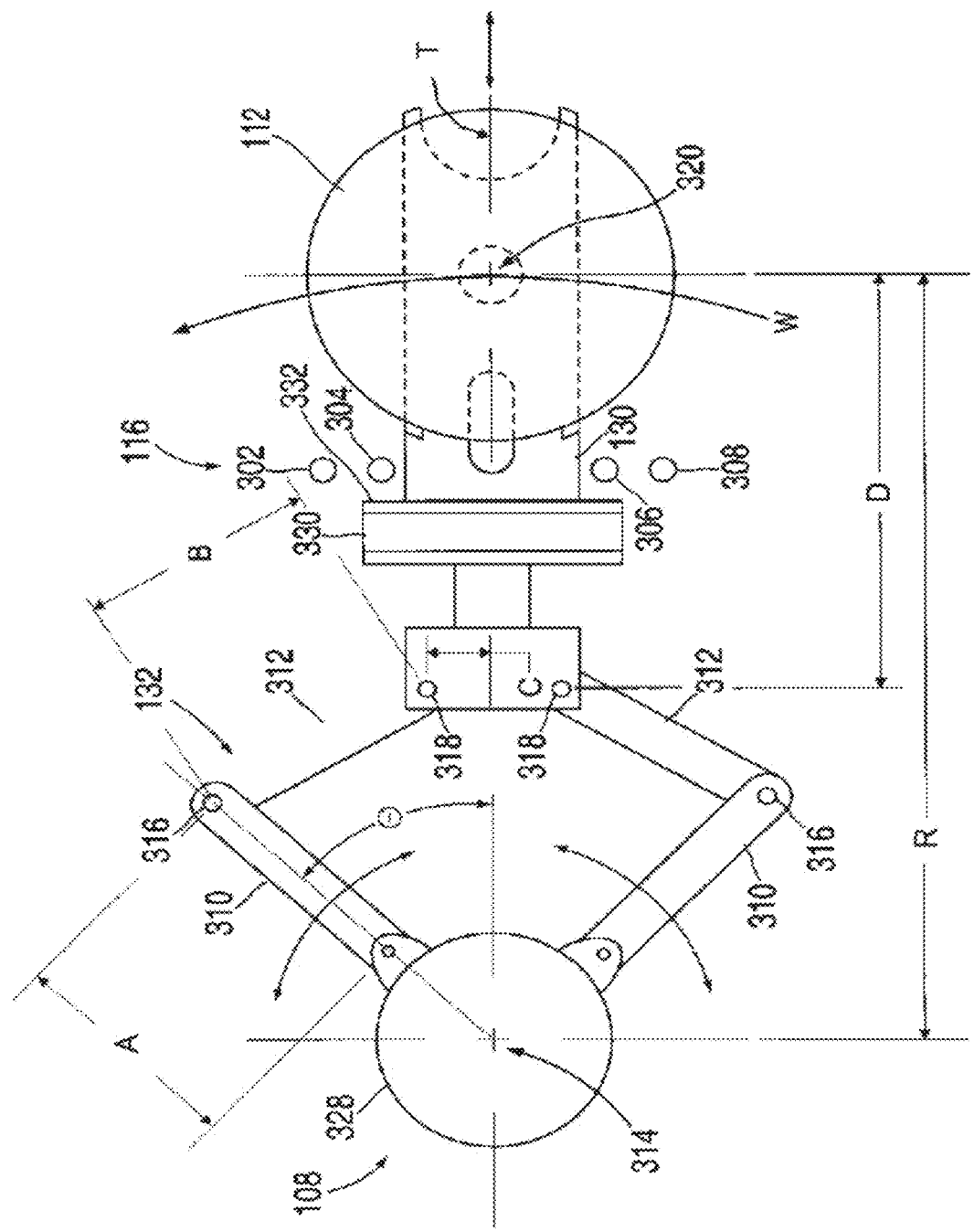
FIG. 3 is a plan view of one embodiment of a process chamber transfer robot.

FIG. 3 shows a plan view of one embodiment of the transfer robot 108. The transfer robot 108 may include a robot body 328 that is attached via the linkage 132 to the blade 130, which supports the substrate 112. In at least one embodiment, the linkage 132 has a frog-leg configuration. Other configurations for the linkage 132, for example, a polar configuration may be alternatively utilized. The linkage 132 may include two wings 310 attached at an elbow 316 to two arms 312. Each wing 310 is additionally in communication with an electric motor (not shown) concentrically stacked within the robot body 328. Each arm 312 may be attached via a bushing 318 to a wrist 330. The wrist 330 attaches the linkage 132 to the blade 130. The linkage 132 may fabricated from aluminum, however, materials having sufficient strength and smaller coefficients of thermal expansion, for example, titanium, stainless steel or a ceramic such as titanium-doped alumina, may also be utilized.

Each wing 310 may be independently controlled by one of the concentrically stacked motors. When the motors rotate in the same direction, the blade 130 is rotated at an angle ω about the center 314 of the robot body 328 at a constant radius. When both of the motors are rotated in opposite directions, the linkage 132 accordingly expands or contracts, thus moving the blade 130 radially inward or outward along T in reference to the center 314 of the robot 108. Of course, the robot 108 is capable of a hybrid motion resulting from combining the radially and rotational motions simultaneously.

Though a particular transfer robot 108 is shown, it should be understood that many different types of transfer robots may be used, and embodiments of the present disclosure are not limited to any particular type of transfer robot. For example, transfer robots that do not have a frog-leg configuration may be used.

As the substrate 112 is moved by the transfer robot 108, the LCF sensor system 116 detects the substrate upon reaching a predetermined position, for example, a position proximate the port 202. In one embodiment, the LCF sensor system 116 includes a bank of sensors, for example four sensors, that may be tripped by different portions of the substrate to capture a plurality of data sets during a single pass of the substrate. For example, an edge of the substrate 112 passing through the beams causes the change of state of a first sensor 302, a second sensor 304, a third sensor 306 and a fourth sensor 308.

As the substrate 112 passes through one or more of the LCF sensors of the LCF sensor system 116, the sensors are changed from a blocked state to an unblocked state or vice versa. The change of the sensor state generally corresponds to the substrate 112 being in a predetermined position relative to the LCF sensor system 116. Each time the substrate 112 passes through any one of these predetermined positions, the positional metrics at the time of the event are recorded in the memory 124 of the controller 120. The positional metrics recorded at each event generally include the sensor number, the sensor state (either blocked or unblocked), the current position of each of the two robot motors, the velocity of the two robot motors and/or a time stamp. Utilizing the substrate metrics recorded at an LCF sensor system at an event (e.g., a substrate passing through the LCF sensor system 116), a radius of the substrate at the time of the event can be computed. A temperature can then be computed based on a CTE of the substrate, a radius of the substrate and a reference radius for the substrate.

Utilizing the substrate metrics recorded at two events (e.g., a first event in which the substrate passes through a first LCF sensor system and a second event in which the substrate passes through a second LCF sensor system, or a first event in which the substrate passes through an LCF sensor system at a first time and a second event in which the substrate passes through the LCF sensor system at a second time), the radius of the substrate can be computed for two different times. The controller 120 can resolve the change in an actual radius of a substrate 112 due to any expansion or contraction of the substrate due to thermal changes. The controller 120 utilizes the radius information as determined from the events (and optionally a known radius of the substrate at room temperature) to determine a temperature and/or a temperature change of the substrate 112.

A method for determining the temperature of the substrate may be stored in the memory 124, typically as software and software routine. The software routine may also be stored and/or executed by a second CPU (not shown) that is remotely located from the system or being controlled by the CPU. According to at least one embodiment, a computer-readable medium may have instructions stored thereon, the instructions, which, when executed by a processor, determine a change in temperature of a substrate in a semiconductor processing system. Such instructions may include acquiring a first set of positional metrics of a first substrate of the one or more substrates generated by a first sensor system, determining a first radius of the first substrate based on the first set of positional metrics, acquiring a second set of positional metrics of the first substrate generated by the first sensor system or a second sensor system, determining a second radius of the first substrate based on the second set of positional metrics, determining a change in radius for the first substrate based on the first radius and the second radius, and determining a temperature change of the first substrate based on the change in radius and a coefficient of thermal expansion of the first substrate. In embodiments, the instructions further include receiving a temperature measurement generated by a temperature sensor coupled to a robot apparatus and comparing the temperature measurement with a temperature of the first substrate. In at least one embodiment, the instructions include determining a first temperature of the first substrate based on the first radius and the coefficient of thermal expansion of the first substrate or determining a second temperature of the first substrate based on the second radius and the coefficient of thermal expansion of the first substrate, comparing the first temperature or the second temperature with an initial substrate temperature for processing the first substrate, and if the first temperature or second temperature is within plus or minus about 50° C. of the initial substrate temperature, initiating substrate processing, or if the first temperature or second temperature is more than plus or minus about 50° C., waiting a period of time before initiating substrate processing. In embodiments, the instructions include determining a first temperature or a second temperature of the first substrate based on the temperature change of the first substrate, comparing the first temperature or the second temperature with an initial substrate temperature for processing the first substrate, and if the first temperature or second temperature is within plus or minus about 50° C. of the initial substrate temperature, initiating substrate processing, or if the first temperature or second temperature is more than plus or minus about 50° C., waiting a period of time before initiating substrate processing.

Figure 4:
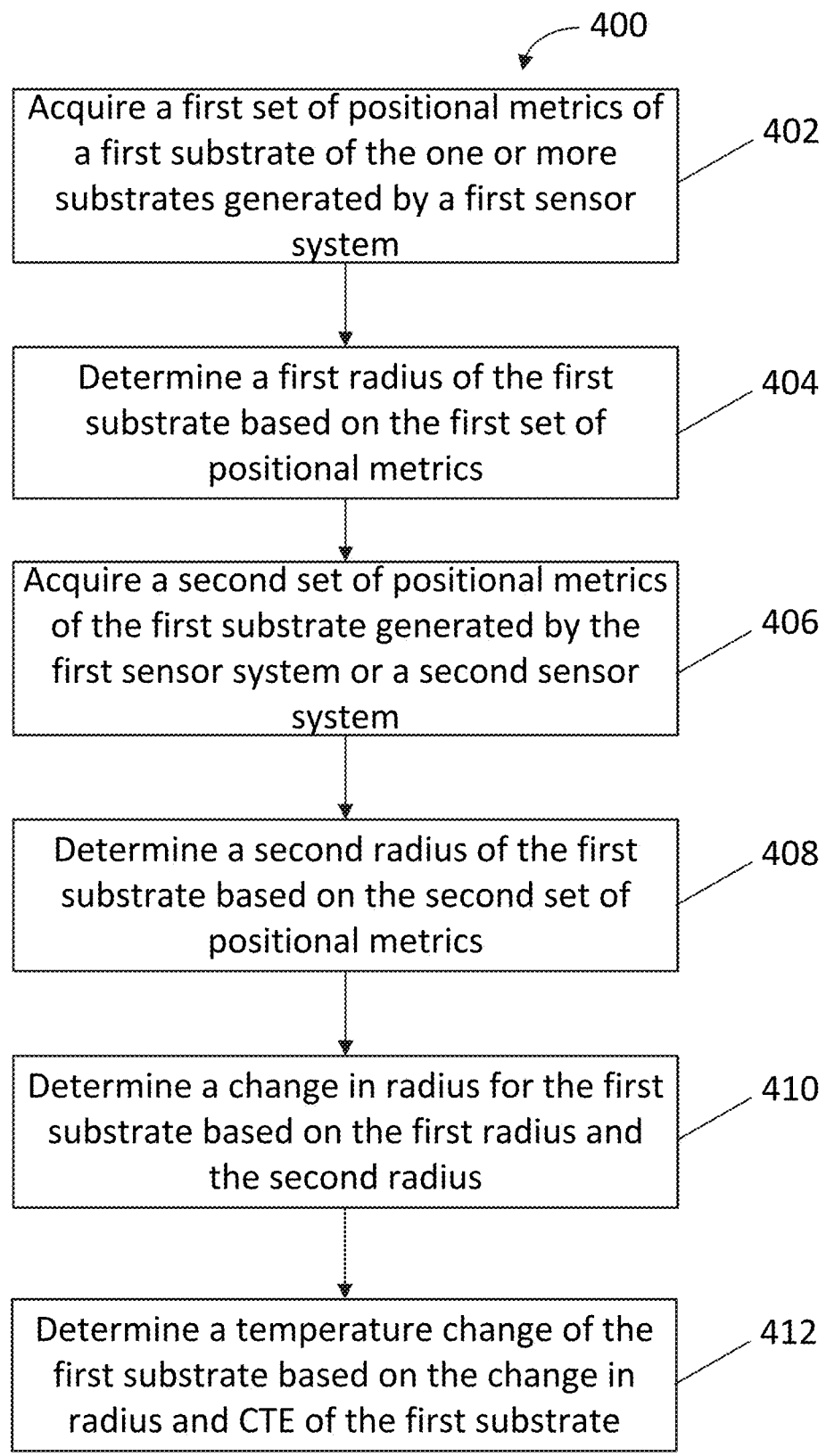
FIG. 4 is a block diagram of one embodiment of a method 400 for determining the position of a substrate according to embodiments.

FIG. 4 shows a block diagram of one embodiment of a method 400 for determining the temperature of a substrate. The method 400 begins at block 402 by acquiring a first set of positional metrics of a first substrate 112 of one or more substrates generated by a first sensor system 116. The first set of substrate positional metrics may be recorded in response to a change in state (i.e., tripping) of one or more of LCF sensor systems 116 as the first substrate 112 passes the one or more LCF sensor systems 116 while being placed into a process chamber 104. Alternatively, or additionally, the one or more LCF sensor systems 116 may be tripped as the first substrate 112 is retrieved from the process chamber 104 or other location. The one or more LCF sensor systems 116 may additionally or alternatively be tripped as the first substrate is retrieved from a load lock or process chamber (e.g., during a retraction of the robot arm) and/or as the first substrate is placed into a load lock or process chamber (e.g., during an extension of the robot arm).

At block 404, the method 400 determines a first radius of the first substrate 112 based on the first set of positional metrics. For example, the center of the first substrate 112 may be determined from the positional metrics recorded as the substrate's edges trigger the one or more LCF sensors of an LCF sensor system 116 as the substrate passes through the LCF sensor system 116. The data points from the perimeter of the first substrate 112 may be used to calculate a center position of the substrate and determine its radius (or diameter) In one embodiment, a centerfind algorithm is performed by converting each latched substrate edge position to an X,Y coordinate system, where 0,0 is at the center of the substrate, and Y extends out away from the center. Next, the list of points (from the latched edge position) are examined and points that are significantly not co-circular with the other points are removed from consideration. Dropped points may be due, for example, to points being latched as a notch or flat present in some substrates 112 as they pass one of the sensors 116. Each of the remaining points are grouped into combinations of three points to define both a triangle and a circle. If the area of the triangle is small, that combination of points may be error sensitive for circle calculation, and excluded from further consideration. Next, the center and radius is calculated for the circle defined by each remaining combination of three points.

At block 406, the method 400 acquires a second set of positional metrics of the first substrate 112 generated by the first sensor system 116 or a second sensor system 116. The second set of positional metrics may be recorded in response to tripping one or more of the LCF sensor of the first or second LCF sensor systems 116 as the substrate passes. The one or more LCF sensors tripped in block 406 may be the same sensor(s) tripped as the substrate 112 was delivered into the process (or other) chamber 104 at block 402. Alternatively, different sensors may be tripped in blocks 402 and 404.

At block 408, the method determines a second radius of the first substrate 112 based on the second set of positional metrics. For example, the center of the first substrate 112 may be determined from the positional metrics recorded as the substrate's edges trigger the one or more LCF sensors as the substrate passes. The data points from the perimeter of the substrate 112 may be used to triangulate a center position of the substrate and determine its radius (or diameter).

At block 410, the method 400 determines a change in radius for the first substrate based on the first radius and the second radius. For example, the change in radius may be determined as the difference between the first radius and the second radius of the first substrate.

At block 412, the method 400 determines a temperature change of the first substrate 112 based on the change in radius and a coefficient of thermal expansion of the material of the first substrate. The temperature of a silicon substrate may be determined based on its change in radius using the CTE as follows:

$$T_{LCF} = \frac{r_{Measured} - r_{Nominal}}{r_{Nominal} \times CTE_{Si}}$$

where silicon has a Coefficient of Thermal Expansion ($CTE_{Si}$) of 2.6e$^{-6}$ m/m° C. Notably, aluminum has a CTE of about 21-24×10$^{-6}$ m/m° C. The temperature change of a substrate may be determined as follows:

$$\Delta T = \frac{\frac{R_{Retract}}{R_{Extend}}}{R_{Extend} \times CTE_{Si}}$$

In at least one embodiment (not shown), the method 400 further includes receiving a temperature measurement generated by a temperature sensor (not shown) coupled to the robot 108 and comparing the temperature measurement with a temperature of the first substrate. The temperature sensor may be positioned on the robot arm at about the halfway point between the robot arm's retracted position and extended position (i.e., positioned about halfway through the extension). According to embodiments, the temperature sensor may be a pyrometer, an infrared sensor and/or a combination thereof.

In embodiments (not shown), method 400 further includes determining a first (absolute) temperature of the first substrate based on the first radius and the coefficient of thermal expansion of the first substrate or determining a second (absolute) temperature of the first substrate based on the second radius and the coefficient of thermal expansion of the first substrate. Once the temperature measurement system has been calibrated to determined the temperature as a function of the radius, the determined radius is indicative of temperature. In embodiments (not shown), method 400 further includes comparing the first temperature or the second temperature with an initial substrate temperature for processing the first substrate. As discussed above, certain process chamber operations are temperature sensitive. If the one or more substrates is too hot or too cool when the process operation begins, then properties of, for example, the deposited film may not meet the specifications. For example, if the first temperature or second temperature is within plus or minus about 50° C., plus or minus about 40° C., plus or minus about 30° C., plus or minus about 25° C., plus or minus about 20° C., plus or minus about 15° C., plus or minus about 10° C., plus or minus about 5° C., plus or minus about 2° C., plus or minus about 1° C., or plus or minus about 1° C. to plus or minus about 50° C., or any individual value or sub-range within this range of the desired initial substrate temperature, method 400 may proceed to initiate substrate processing by the process chamber 104. Alternatively, if the first temperature or second temperature is more than plus or minus about 50° C., plus or minus about 40° C., plus or minus about 30° C., plus or minus about 25° C., plus or minus about 20° C., plus or minus about 15° C., plus or minus about 10° C., plus or minus about 5° C., plus or minus about 2° C., plus or minus about 1° C., or plus or minus about 1° C. to plus or minus about 50° C., or any individual value or sub-range within this range outside the initial substrate processing temperature, then the method 400 may cause the process chamber 104 to wait a period of time before initiating substrate processing.

In yet further embodiments, the first temperature or the second temperature of the first substrate may be determined based on the determined temperature change of the first substrate. For example, if the processing temperature of one or more substrates in a process chamber 104 is 500° C. and the method determines that the temperature of the first substrate has changed by 100° C. while it is transferred from the process chamber 104 after processing to the load lock chamber 114, then the system determines that the temperature of the one or more substrate at the load lock is 400° C. The method 400 may then compare the first temperature or the second temperature to an initial substrate processing temperature as discussed above.

Figure 5:
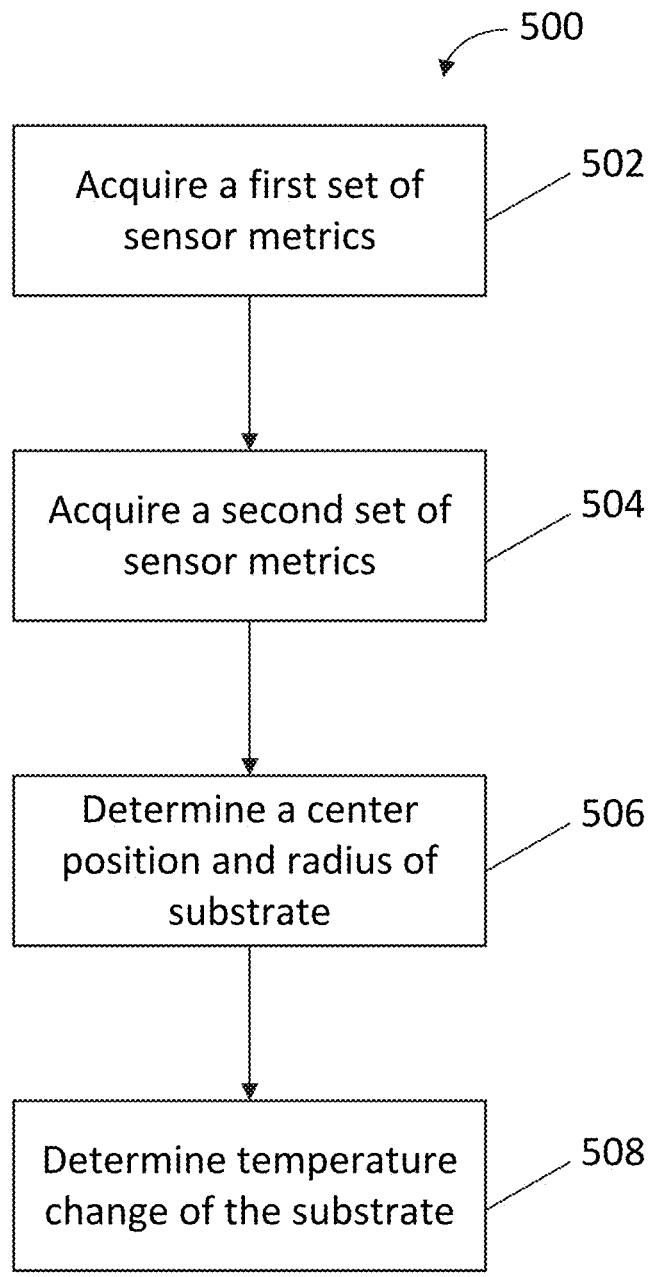
FIG. 5 is a block diagram of one embodiment of a method 500 for determining the position of a substrate according to embodiments.

FIG. 5 shows a block diagram of one embodiment of a method 500 for determining the temperature of a substrate. The method 500 begins at block 502 by acquiring a first set of substrate metrics. The first set of substrate metrics may recorded in response to a change in state (i.e., tripping) of one or more of the LCF sensors 116 as the substrate 112 passes the LCF sensor 116 while delivering the substrate 112 into one of the process chambers 104. Alternatively, the LCF sensor 116 may be tripped as the substrate 112 is retrieved from the process chamber 104 or other location.

At block 504, a second set of substrate metrics is acquired. The second set of substrate metrics may be recorded in response to tripping one of the one or more LCF sensors 116 as the substrate passes one of the one or more LCF sensors 116. Typically, the one or more LCF sensors 116 tripped in block 504 is(are) the same sensor(s) tripped as the substrate 112 was delivered into the process (or other) chamber 104 in block 502. Alternatively, different sensors may be tripped in blocks 502 and 504.

At block 506, method 500 may determine a center position of the substrate 112 disposed on the blade 330 and a radius (or diameter) of the substrate 112. The center of the first substrate 112 may be determined from the positional metrics recorded as the substrate's edges trigger the one or more LCF sensors 116 as the substrate passes. The data points from the perimeter of the first substrate 112 may be used to triangulate a center position of the substrate and determine its radius (or diameter).

At block 508, the method 500 determines a temperature change of the substrate 112 based on the change in radius and a coefficient of thermal expansion of the material of the first substrate. For example, the temperature may be determined as set forth above at block 412 of method 400.

Figure 6:
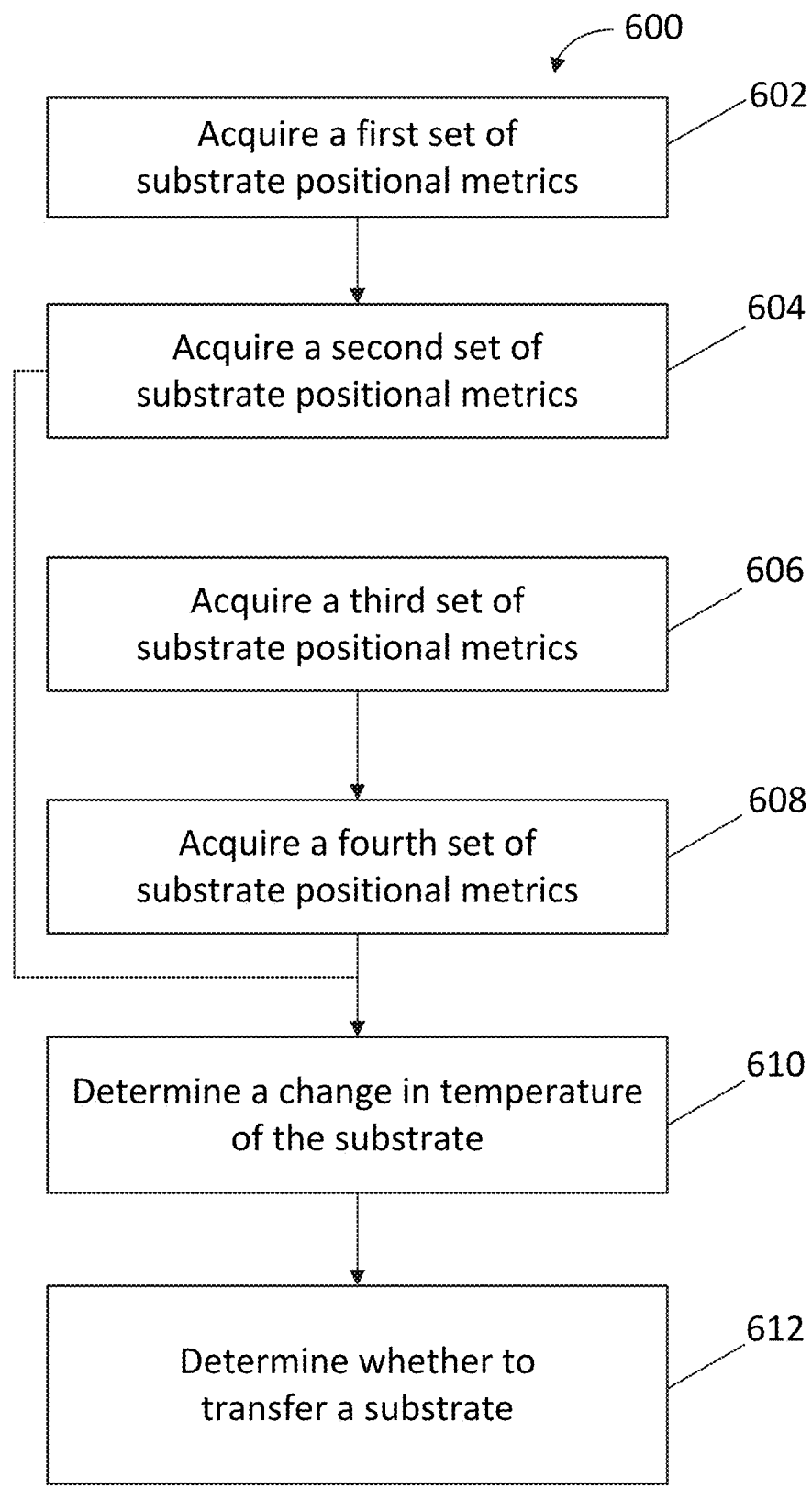
FIG. 6 is a flow diagram of a method 600 for measuring temperature of a substrate according to embodiments.

FIG. 6 shows a block diagram of one embodiment of a method 600 for determining the temperature change of the one or more substrates. The method 600 begins at block 602 by acquiring a first set of positional metrics from a first location. The first set of substrate positional metrics may be recorded in response to a change in state (i.e., tripping) of a first LCF sensor system 116 as the one or more substrate passes as the first LCF sensor system 116 while delivering the one or more substrates 112 into the first location (e.g., one of the process chambers 104, one of the load lock chambers 106, etc.) and/or as the one or more substrates 112 are retrieved from the first location.

At block 604, a second set of substrate positional metrics may be acquired. The second set of substrate positional metrics may be recorded in response to tripping the first LCF sensor system 116 as the substrate passes. The first LCF sensor system 116 tripped at block 604 may be the same sensor system that was tripped as the one or more substrates 112 were delivered to the first location in block 602. Alternatively, a different LCF sensor system may be tripped at block 604 than at block 602.

At block 606, method 600 includes acquiring a third set of substrate positional metrics from a second location. The third set of substrate positional metrics may be recorded in response to a change in state (i.e., tripping) of a second LCF sensor system 116 as the substrate passes the second LCF sensor system 116 while delivering the one or more substrates 112 into the second location (e.g., one of the process chambers 104, one of the load lock chambers 106, etc.) and/or as the one or more substrates 112 are retrieved from the second location.

At block 608, a fourth set of substrate positional metrics may be acquired. The fourth set of substrate positional metrics may be recorded in response to tripping the second LCF sensor system 116 as the substrate passes the second LCF sensor system 116. The second LCF sensor system 116 tripped at block 604 may be the same sensor system that was tripped as the one or more substrates 112 were delivered to the first location in block 606. Alternatively, a different LCF sensor system may be tripped at block 608 than at block 604.

At block 610, method 600 may include, as shown in FIG. 6, determining a change in temperature of the one or more substrates between the first and second set of substrate positional metrics and between the third and fourth set of substrate positional metrics. In at least one embodiment, the first and second sets of substrate metrics are taken at a first location (e.g., a process chamber) and the third and fourth sets of substrate metrics are taken at a second location (e.g., a load lock) and method 600 can determine a change in temperature between the first location and the second location. According to at least one embodiment, the temperature of the one or more substrates entering a process chamber and leaving the process chamber, leaving the process chamber and entering a load lock, leaving the load lock and entering a process chamber, and/or leaving a first process chamber and entering a second process chamber, may be measured and compared using the centerfind system including the LCF sensor measurements and the centerfind calculations as described herein. For example, the radius of the one or more substrates may be determined using the first and second set of substrate positional metrics from the first location. The radius of the one or more substrates also may be determined using the third and fourth set of substrate positional metrics from the second location. Using the CTE and methods as described herein, the temperature of the one or more substrates at the first location and the second location (or at a first time point and a second time point) may be determined as well as the change in temperature (ΔT) between the two locations (or points in time).

Alternatively, the method may determine the radius of the one or more substrates using the first and second set of substrate positional metrics from the first location and the temperature at that location and then determine the time for the one or more substrates to move from the first location to the second location. The temperature during transport of the one or more substrates may be at ambient temperature (e.g., about 20° C. to about 25° C.). The method 600 may then estimate or determine the temperature of the one or more substrates at the second location.

According to embodiments, method 600 may include at block 612, determining based on the temperature change of the one or more substrates between the first location and the second location and/or the temperate of the one or more substrates at the second location, whether to transfer the one or more substrates to a third location (e.g., from the load lock to another process chamber). For example, the one or more substrates may need to cool to room temperature or another temperature before being processed by a process chamber in a subsequent process operation Estimating or predicting the temperature of the one or more substrates can increase throughput by reducing the amount of waiting time before transferring the one or more substrates and also can prevent issues that may arise if one or more substrates begin the next process operation at a temperature that is too high or too low.

While method 600 generally has been described with respect to moving one or more substrates between two different locations, it should be noted that the same method may be practiced by measuring the radius of a substrate both before and after completion of a process operation at the same location. For example, the size of the one or more substrates may be measured by the first LCF sensor 116 when placing the one or more substrates in the process chamber and again by the first LCF sensor 116 when retrieving the one or more substrates from the process chamber. The set of substrate metrics together with the centerfind calculations described herein may be used to determine the initial and final temperatures and the temperature change of the one or more substrates.

Figure 7:
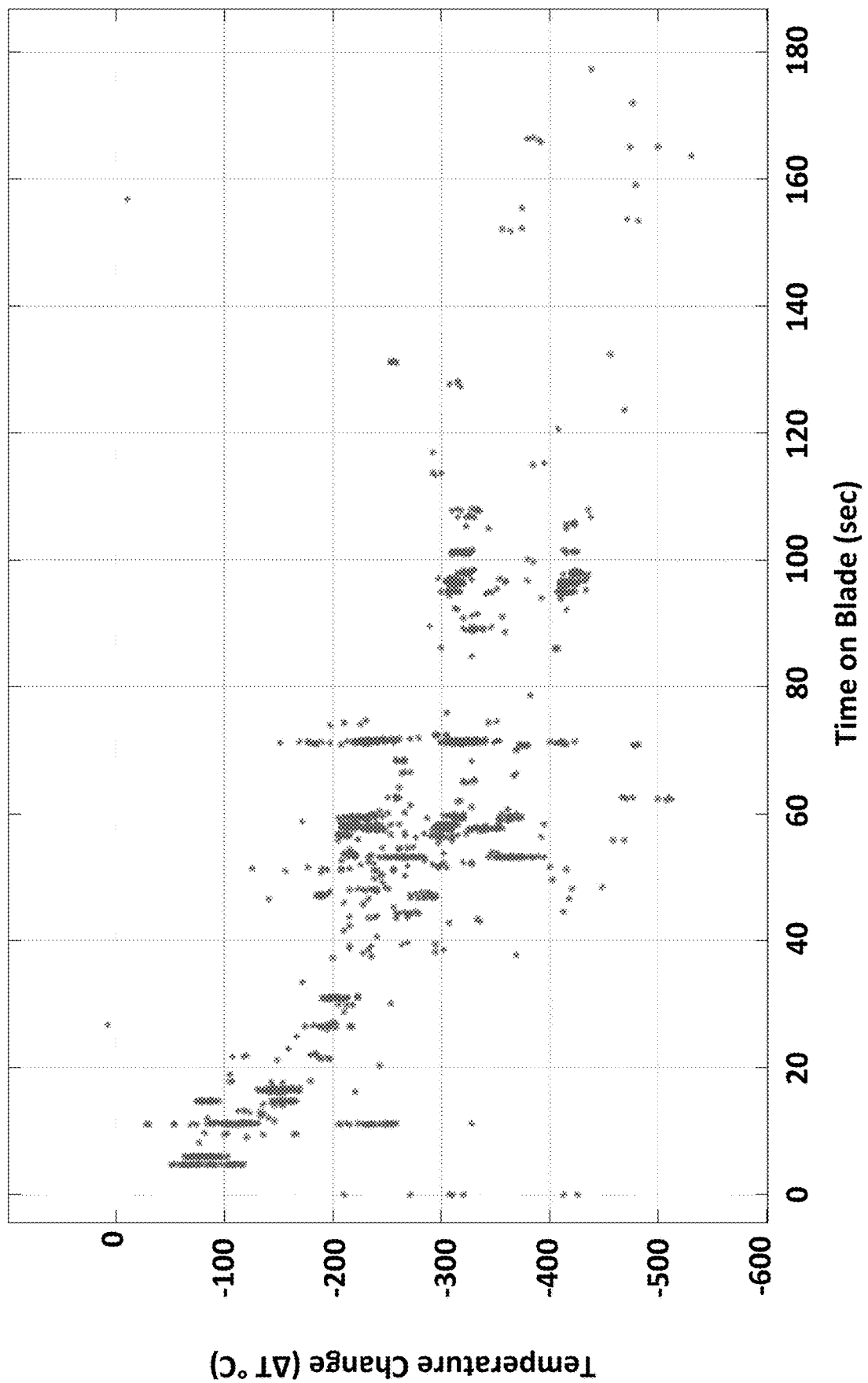
FIG. 7 is a chart showing the temperature change of several substrates as a function of time on a robot blade as measured using the systems and methods according to embodiments herein.

With reference to FIG. 7, the temperatures of several substrates were determined, using the LCF sensor measurements and the centerfind algorithm, as they were transferred from a process chamber to a load lock. As shown in FIG. 7, the temperature change ($\Delta T$) of each substrate was graphed as a function of the time the substrate was on the robot blade. Notably, the initial temperature of a substrate resulted from the operating temperature of the process chamber for a particular process operation. That is, different substrates were processed at different temperatures by the same reactor. For example, a substrate may have been processed at about 600° C., 550° C. or 450° C. There are multiple pathways that a substrate will lose heat upon completion of a process operation including conduction loss (e.g., to the robot blade), convection loss (e.g., from the heated gas within the chamber), radiative loss and evaporative losses (e.g., evaporation of materials deposited on the substrate). As such, it is useful to determine and understand the temperature change of a certain type of substrate (e.g., a silicon substrate) within a particular system. As shown in FIG. 7, the temperature change of the substrates decreased logarithmically as a function of the time that the substrate was on the robot blade. A substrate beginning at a temperature of about 600° C. initially experienced a greater decrease in temperature as compared to a substrate beginning at a temperature of about 450° C. over the same time period. For example, the temperature of a substrate may decrease by about 100° C. within about 10 seconds and by about 200° C. in about 30 seconds.

Certain processes dictate that a substrate be below a specific temperature before the process can perform the next process operation. The temperature change of a substrate within a transfer system as the substrate moves from a process chamber to a load lock chamber is useful to estimate or determine the temperature of the substrate as it arrives at the load lock chamber. Estimates or determinations of the temperature of a substrate in a load lock chamber can be used to adjust a process recipe and/or to automatically increase or decrease the cooling time of the substrate within the load lock chamber as needed. In some embodiments, determining the temperature of one or more substrates within the load lock chamber may be useful to increase throughput of the substrates through the entire processing system. In embodiments, the robot retrieving and transferring a substrate may have a plurality of blades. For example, a first substrate may be retrieved with a first blade and begins to cool while resting on the blade. The robot may then retrieve a second substrate with a second blade, and the second substrate begins cooling at a later point in time than the first substrate. As evidenced by FIG. 7, the first and second substrates will be at different temperatures as they are transferred to the load lock chamber and continue to cool until they reach the same temperature. Measuring the temperatures of the substrates and understanding the lead-time for both substrates to reach a particular temperature is useful to optimize a process that relies on temperature parameters. Additionally, measuring the transfer temperatures of substrates may be helpful in troubleshooting substrates that are determined to be out of specifications. For example, if a substrate fails a quality test, the temperature information of that substrate during transfer and placement within a processing chamber may be useful when troubleshooting the failure.

Figure 8:
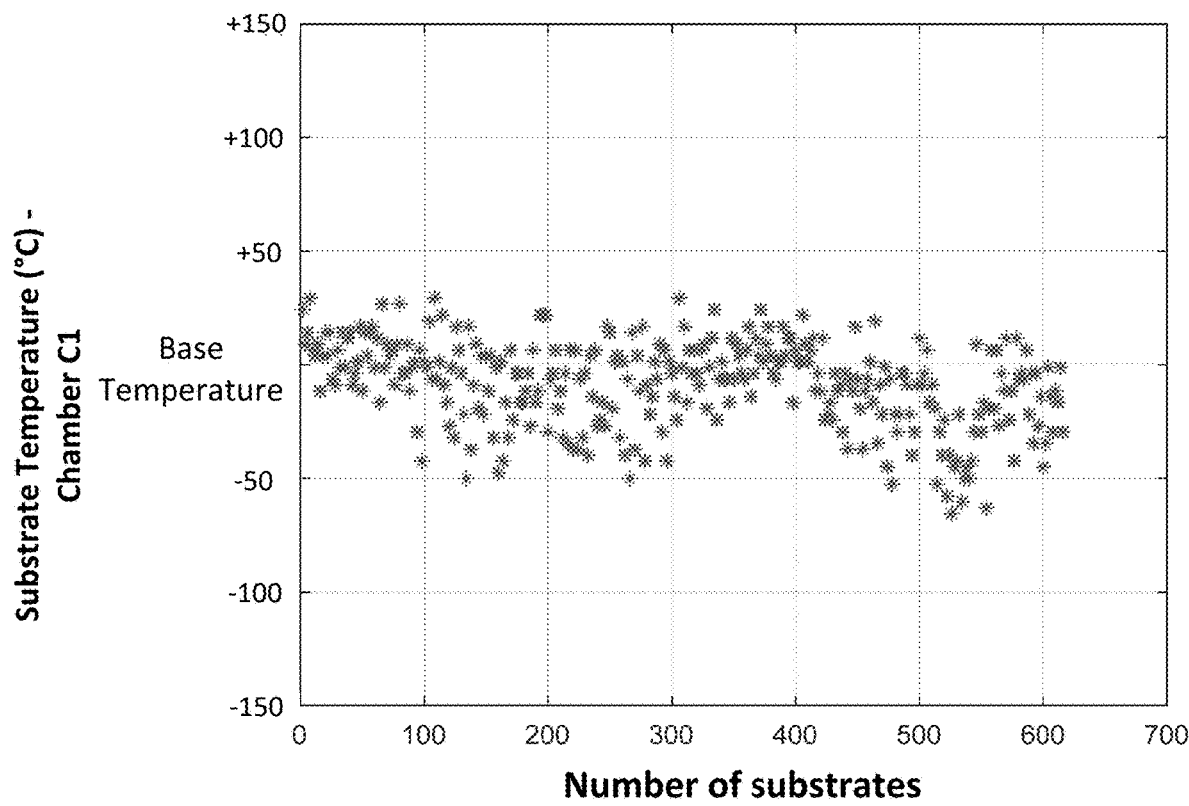
FIG. 8 is a chart showing the temperature of several substrates as a function of the number of substrates measured in a first chamber C1 using the systems and methods according to embodiments herein.

With reference to FIG. 8, the temperature change of a substrate was measured when entering ($T_i$) and leaving ($T_o$) a first process chamber ($C_1$) operating at about 550° C. $T_i$ was expected to be at about 20° C. and $T_o$ was expected to be increased by about 1° C. to about 1000° C. for a $\Delta T$ of about 1° C. to about 980° C. As shown in FIG. 8, the temperature change as measured within about 10 sec of the substrate exiting the process chamber (the substrate's position being determined by an LCF system) was within the degree of error (e.g., ±50° C.) expected for the temperature measurement device.

Figure 9:
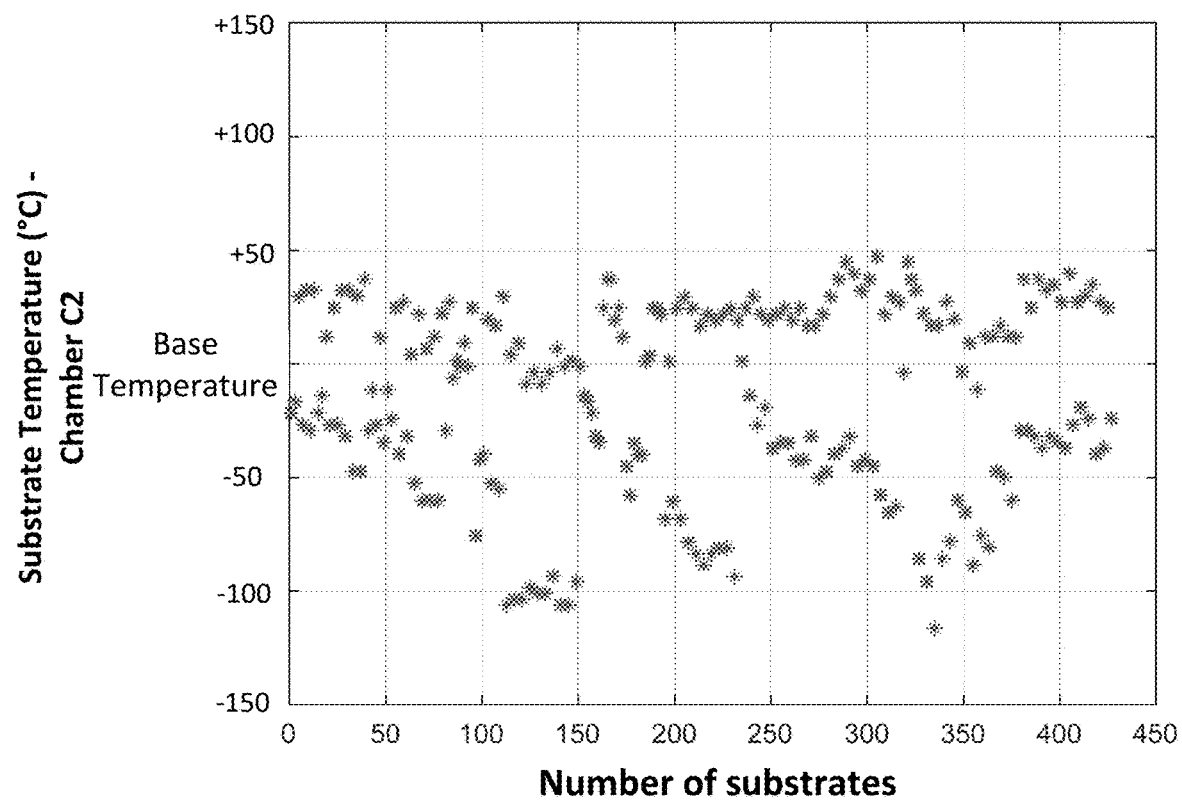
FIG. 9 is a chart showing the temperature of several substrates as a function of the number of the substrates measured in a second chamber C2 using the systems and methods according to embodiments herein.

Similarly, the temperature change of a substrate entering and leaving a second process chamber ($C_2$) that operated at a variety of target temperatures, depending on the requirements of a particular process operation, also was measured as shown in FIG. 7. When comparing the temperature changes set forth in FIGS. 8 and 9 to the temperature change data as shown in FIG. 7, it was determined under several instances, that much of the temperature change occurred within the process chamber while the substrate was waiting for transport to, for example, a load lock.

Reference throughout this specification to, for example, "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

As used herein, the singular forms "a," "an," and "the" include plural references unless the context clearly indicates otherwise. Thus, for example, reference to "a lift pin" includes a single lift pin as well as more than one lift pin.

As used herein, the term "about" in connection with a measured quantity, refers to the normal variations in that measured quantity as expected by one of ordinary skill in the art in making the measurement and exercising a level of care commensurate with the objective of measurement and the precision of the measuring equipment. In certain embodiments, the term "about" includes the recited number 10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Unless otherwise indicated, all parts and percentages are by weight. Weight percent (wt. %), if not otherwise indicated, is based on an entire composition free of any volatiles, that is, based on dry solids content.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

I claim:

1. An electronic device manufacturing system, comprising:
   a robot apparatus configured to transport a substrate;
   a first sensor system configured to detect the substrate supported by the robot apparatus; and
   a controller to:
   acquire a first set of positional metrics of the substrate generated by the first sensor system;
   determine a first radius of the substrate based on the first set of positional metrics;
   acquire a second set of positional metrics of the substrate generated by the first sensor system or a second sensor system;
   determine a second radius of the substrate based on the second set of positional metrics;
   determine a change in radius for the substrate based on the first radius and the second radius; and
   determine a temperature change of the substrate based on the change in radius and a coefficient of thermal expansion of the substrate.

2. The electronic device manufacturing system of claim 1, wherein the first sensor system or the second sensor system comprise one or more sensor independently selected from the group consisting of an optical sensor, a proximity sensor, a limit switch, a reed switch and a hall-effect switch.

3. The electronic device manufacturing system of claim 1, further comprising:
   a transfer chamber, wherein the first sensor system is disposed within the transfer chamber proximate to a first aperture in a first sidewall of the transfer chamber;
   wherein the first sensor system is to generate the first set of positional metrics at a first time during retraction of the robot apparatus, and wherein the first sensor system is to generate the second set of positional metrics at a second time during extension of the robot apparatus.

4. The electronic device manufacturing system of claim 1, further comprising:
   a transfer chamber, wherein the first sensor system is disposed within the transfer chamber proximate to a first aperture in a first sidewall of the transfer chamber, and wherein the second sensor system is disposed within the transfer chamber proximate to a second sidewall of the transfer chamber;
   wherein the first sensor system is to generate the first set of positional metrics at a first time during a first retraction or extension of the robot apparatus, and wherein the second sensor system is to generate the second set of positional metrics at a second time during a second retraction or extension of the robot apparatus.

5. The electronic device manufacturing system of claim 1, further comprising at least one temperature sensor coupled to the robot apparatus.

6. The electronic device manufacturing system of claim 5, wherein the at least one temperature sensor is positioned halfway between a retracted position of the robot apparatus and an extended position of the robot apparatus.

7. The electronic device manufacturing system of claim 5, wherein the controller is further to:
   receive a temperature measurement generated by the at least one temperature sensor; and
   compare the temperature measurement with a temperature of the substrate.

8. The electronic device manufacturing system of claim 7, wherein the controller is further to:
   compare the temperature measurement with an initial substrate temperature for processing the substrate; and
   if the temperature measurement is within plus or minus about 50° C. of the initial substrate temperature, initiate substrate processing, or
   if the temperature measurement is more than plus or minus about 50° C., wait a period of time before initiating substrate processing.

9. The electronic device manufacturing system of claim 1, wherein the controller is further to:
   determine a first temperature of the substrate based on the first radius and the coefficient of thermal expansion of the substrate or determine a second temperature of the substrate based on the second radius and the coefficient of thermal expansion of the substrate;
   compare the first temperature or the second temperature with an initial substrate temperature for processing the substrate; and
   if the first temperature or second temperature is within plus or minus about 50° C. of the initial substrate temperature, initiate substrate processing, or
   if the first temperature or second temperature is more than plus or minus about 50° C., wait a period of time before initiating substrate processing.

10. The electronic device manufacturing system of claim 1, wherein the controller is further to:
    determine a first temperature or a second temperature of the substrate based on the temperature change of the substrate;
    compare the first temperature or the second temperature with an initial substrate temperature for processing the substrate; and
    if the first temperature or second temperature is within plus or minus about 50° C. of the initial substrate temperature, initiate substrate processing, or
    if the first temperature or second temperature is more than plus or minus about 50° C., wait a period of time before initiating substrate processing.

11. A method of determining a temperature change of a substrate, the method comprising:
    acquiring a first set of positional metrics of the substrate generated by a first sensor system;

determining a first radius of the substrate based on the first set of positional metrics;
acquiring a second set of positional metrics of the substrate generated by the first sensor system or a second sensor system;
determining a second radius of the substrate based on the second set of positional metrics;
determining a change in radius for the substrate based on the first radius and the second radius; and
determining a temperature change of the substrate based on the change in radius and a coefficient of thermal expansion of the substrate.

12. The method of claim 11, wherein the first sensor system or the second sensor system comprise one or more sensor independently selected from the group consisting of an optical sensor, a proximity sensor, a limit switch, a reed switch and a hall-effect switch.

13. The method of claim 11, further comprising:
receiving a temperature measurement generated by a temperature sensor coupled to a robot apparatus; and
comparing the temperature measurement with a temperature of the substrate.

14. The method of claim 11, further comprising:
determining a first temperature of the substrate based on the first radius and the coefficient of thermal expansion of the substrate or determining a second temperature of the substrate based on the second radius and the coefficient of thermal expansion of the substrate;
comparing the first temperature or the second temperature with an initial substrate temperature for processing the substrate; and
if the first temperature or second temperature is within plus or minus about 50° C. of the initial substrate temperature, initiating substrate processing, or
if the first temperature or second temperature is more than plus or minus about 50° C., waiting a period of time before initiating substrate processing.

15. The method of claim 11, further comprising:
determining a first temperature or a second temperature of the substrate based on the temperature change of the substrate;
comparing the first temperature or the second temperature with an initial substrate temperature for processing the substrate; and
if the first temperature or second temperature is within plus or minus about 50° C. of the initial substrate temperature, initiating substrate processing, or
if the first temperature or second temperature is more than plus or minus about 50° C., waiting a period of time before initiating substrate processing.

16. A non-transitory computer-readable medium having stored thereon a plurality of instructions, the plurality of instructions comprising instructions which, when executed by a processor, determine a change in temperature of a substrate in a semiconductor processing system comprising:
acquiring a first set of positional metrics of the substrate generated by a first sensor system;
determining a first radius of the substrate based on the first set of positional metrics;
acquiring a second set of positional metrics of the substrate generated by the first sensor system or a second sensor system;
determining a second radius of the substrate based on the second set of positional metrics;
determining a change in radius for the substrate based on the first radius and the second radius; and
determining a temperature change of the substrate based on the change in radius and a coefficient of thermal expansion of the substrate.

17. The non-transitory computer-readable medium of claim 16, further comprising:
receiving a temperature measurement generated by a temperature sensor coupled to a robot apparatus; and
comparing the temperature measurement with a temperature of the substrate.

18. The non-transitory computer-readable medium of claim 16, further comprising:
determining a first temperature of the substrate based on the first radius and the coefficient of thermal expansion of the substrate or determining a second temperature of the substrate based on the second radius and the coefficient of thermal expansion of the substrate;
comparing the first temperature or the second temperature with an initial substrate temperature for processing the substrate; and
if the first temperature or second temperature is within plus or minus about 50° C. of the initial substrate temperature, initiating substrate processing, or if the first temperature or second temperature is more than plus or minus about 50° C., waiting a period of time before initiating substrate processing.

19. The non-transitory computer-readable medium of claim 16, further comprising:
determining a first temperature or a second temperature of the substrate based on the temperature change of the substrate;
comparing the first temperature or the second temperature with an initial substrate temperature for processing the substrate; and
if the first temperature or second temperature is within plus or minus about 50° C. of the initial substrate temperature, initiating substrate processing, or
if the first temperature or second temperature is more than plus or minus about 50° C., waiting a period of time before initiating substrate processing.

20. The non-transitory computer-readable medium of claim 16, wherein the first sensor system or the second sensor system comprise one or more sensor independently selected from the group consisting of an optical sensor, a proximity sensor, a limit switch, a reed switch and a hall-effect switch.

* * * * *